(12) United States Patent
King et al.

(10) Patent No.: US 6,291,997 B1
(45) Date of Patent: Sep. 18, 2001

(54) CORRECTION FOR GRADIENT AMPLIFIER HYSTERESIS IN ACQUIRED MRI DATA

(75) Inventors: Kevin F. King, New Berlin; Alexander Ganin, Whitefish Bay; Neville D. Gai, Hartland, all of WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/452,440

(22) Filed: Dec. 2, 1999

(51) Int. Cl.[7] .................................................. G01V 3/00

(52) U.S. Cl. ........................................................ 324/319

(58) Field of Search ...................... 324/309, 319

(56) References Cited

U.S. PATENT DOCUMENTS

| | | | |
|---|---|---|---|
| 6,043,656 | * | 3/2000 | Ma et al. .............................. 324/309 |
| 6,066,949 | * | 5/2000 | Alley et al. .......................... 324/309 |

* cited by examiner

*Primary Examiner*—Hezron Williams
*Assistant Examiner*—Dixomara Vargas
(74) *Attorney, Agent, or Firm*—Quarles & Brady, LLP; Christian G. Cabou

(57) ABSTRACT

Image artifacts produced by residual magnetization in elements of the gradient field amplifier system are reduced by driving the residual magnetization to a preselected value at the end of each imaging pulse sequence. Reset gradient pulses are produced by the gradient field amplifier system after each signal is acquired to drive the residual magnetization to a selected value. A number of different reset gradient waveforms may be used, and they may be produced in a number of different ways.

13 Claims, 5 Drawing Sheets

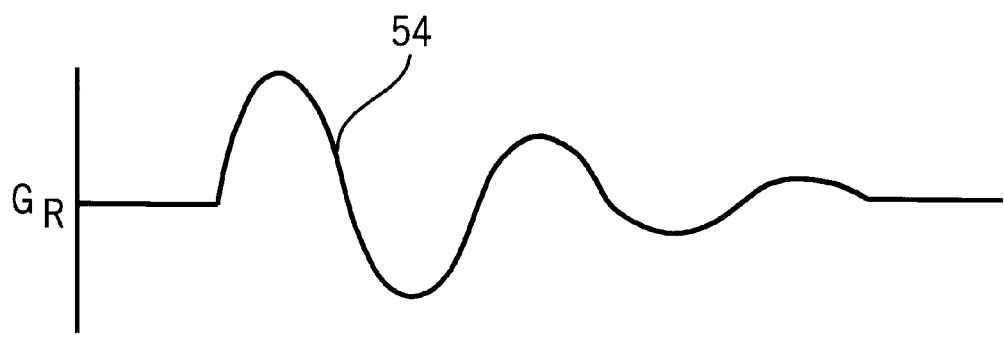
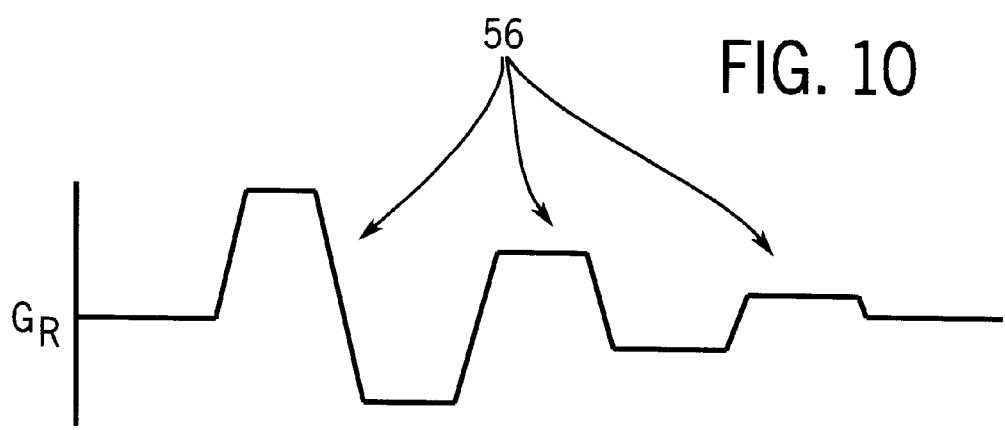

CORRECTION FOR GRADIENT AMPLIFIER HYSTERESIS IN ACQUIRED MRI DATA

BACKGROUND OF THE INVENTION

The field of the invention is nuclear magnetic resonance imaging (MRI) methods and systems. More particularly, the invention relates to the acquisition of MRI data with pulse sequences which sample k-space with interleaved non-rectilinear readout patterns such as spirals, rosettes and radial projections.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well-known reconstruction techniques.

Many different pulse sequences are known in the art for acquiring NMR signals from which an image may be reconstructed. Most of these pulse sequences sample k-space in a rectilinear pattern, but there is a class of pulse sequences which sample k-space in non-rectilinear patterns. As disclosed in U.S. Pat. Nos. 5,604,435; RE 32,712, for example, a spiral sampling pattern is achieved by applying a sinusoidally varying readout magnetic field gradient during acquisition of each NMR signal. Similarly, the readout magnetic field gradient can be varied to sample a rosette pattern in k-space. When these non-rectilinear pulse sequences are employed to sample k-space in a set of interleaved patterns, the readout gradients are different at the end of each interleave. Rewinder gradient pulses are often used at the end of such pulse sequences to return the spin magnetization to the center of k-space and the size of these will vary from one interleave to the next.

Severe image artifacts can be produced when using interleaved spiral scans on certain MRI systems. The problem was observed to be greater when the TE period of the pulse sequence was very long (e.g. 30 to 100 msec.). Such pulse sequences are used, for example, when acquiring functional MRI data from the brain of a patient.

SUMMARY OF THE INVENTION

The present invention is the discovery of a source of image artifacts in NMR data acquired with non-rectilinear sampling pulse sequences, and a solution which reduces or eliminates such artifacts. More particularly the present invention is the addition of a hysteresis reset gradient pulse at the end of the non-rectilinear pulse sequence which drives the residual magnetization in an iron core device employed in the gradient amplifier of the MRI system to a predetermined value. Such a hysteresis reset gradient can take a number of different waveforms, including of a series of alternating polarity gradient pulses that drive the residual magnetization to substantially zero.

BRIEF DESCRIPTION OF THE DRAWINGS

FIGS. 7–10 are alternative embodiments of the hysteresis reset gradient pulse which may be employed in the pulse sequence of FIG. 6.

GENERAL DESCRIPTION OF THE INVENTION

Figure 2:
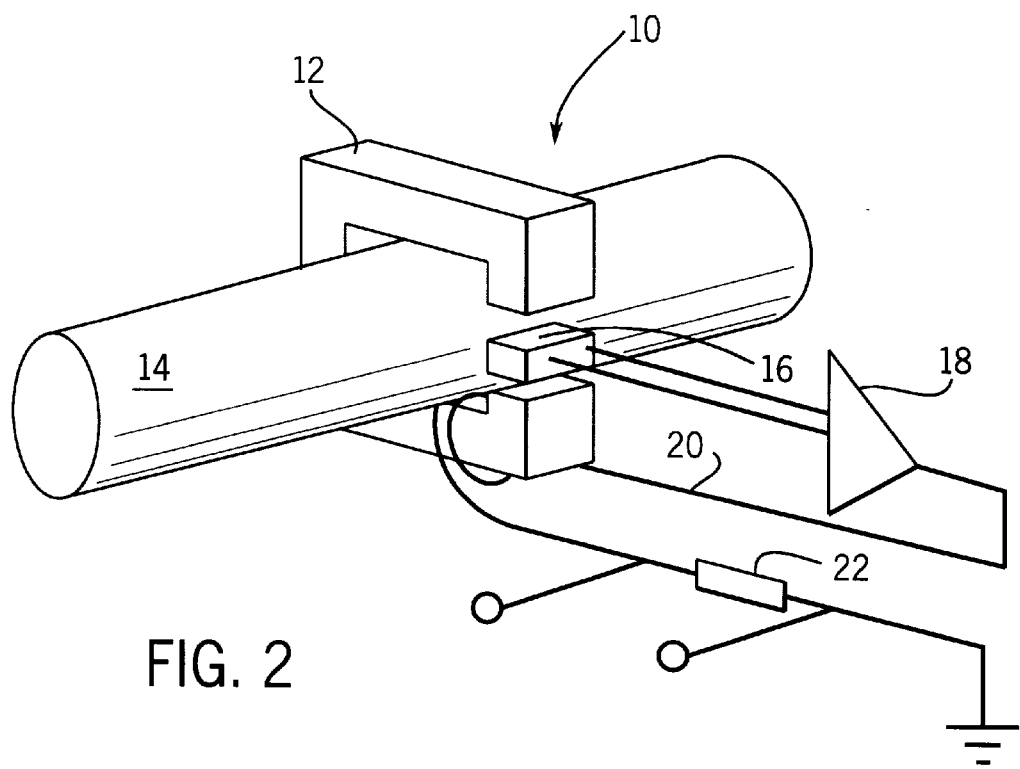
FIG. 2 is a perspective schematic diagram of a current monitor employed in gradient amplifiers that form part of the MRI system of FIG. 1.

Gradient amplifiers typically use feedback mechanisms to constantly monitor the output current and ensure that accurate gradient waveforms are produced. Accuracy of the current monitor is essential to maintaining temporal fidelity of the gradient waveforms for proper MR imaging. Referring to FIG. 2, one type of current monitor 10 uses an iron ring 12 placed around the gradient amplifier output wire 14 to measure the magnetic field created by the current (primary current). In one type of current monitor, a Hall effect transducer 16 senses the magnetic field in the iron ring 12 that is induced by the primary current. The Hall effect transducer 16 drives an amplifier 18 to create a secondary current in a copper wire 20 which is wound around the iron ring 12. The secondary current creates a magnetic field which nulls the magnetic field from the primary current. The primary current is then proportional to the secondary current, and the secondary current produces a voltage across a measuring resistor 22 which is the current monitor output signal.

Figure 3:
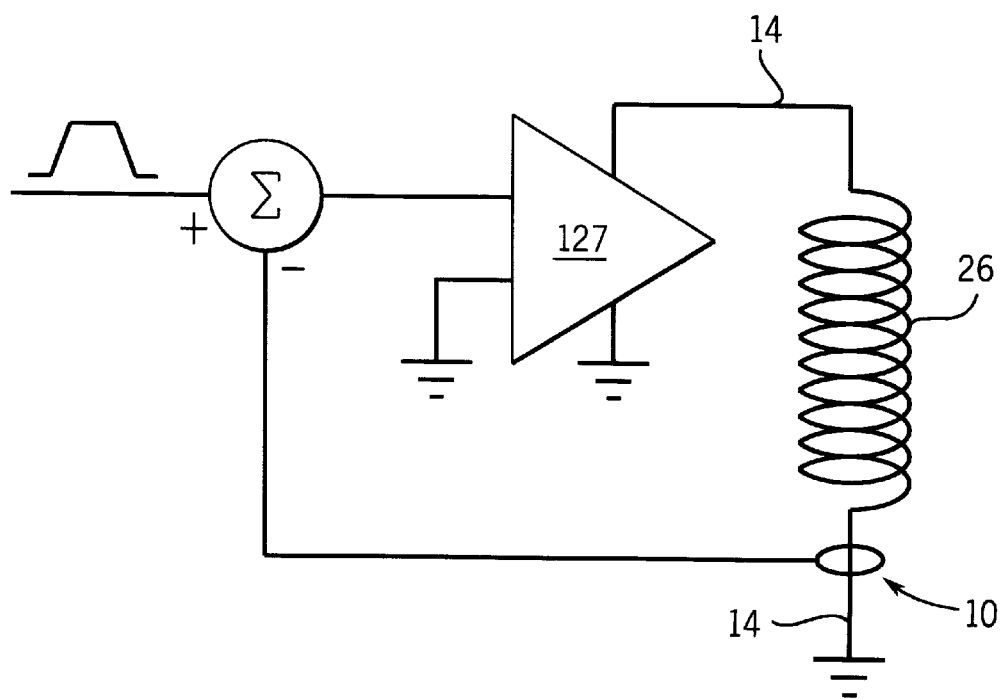
FIG. 3 is an electrical schematic diagram of a gradient amplifier illustrating how the current monitor of FIG. 2 is used.

Referring to FIG. 3, the output signal from the monitor circuit 10 is compared with the gradient waveform current command input to a gradient amplifier 127. The gradient amplifier 127 produces an output current that flows through a gradient coil 26 in a gradient coil assembly and the wire 14. The accuracy of the current applied to the gradient coil 26 is determined in part by the accuracy of the feedback signal produced by the current monitor 10.

Figure 4:
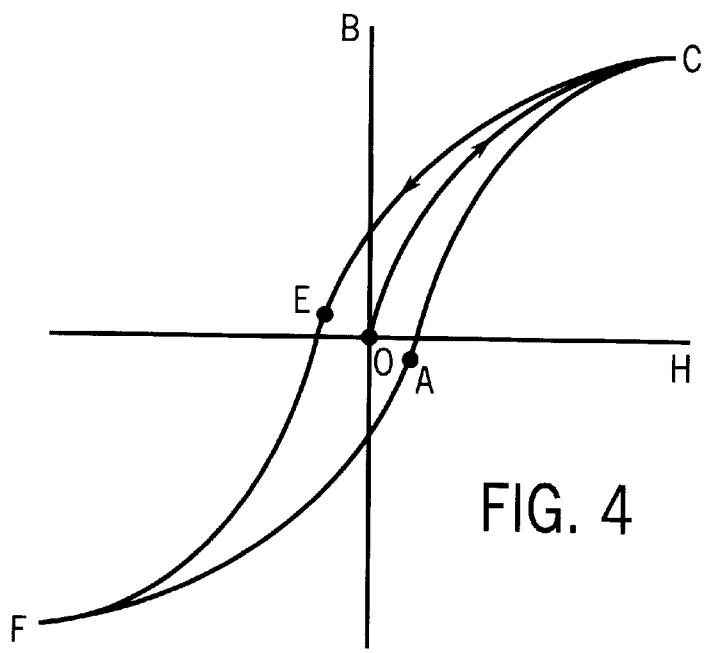
FIGS. 4 and 5 are graphic representations of a hysteresis curve for an iron ring employed in the current monitor of FIG. 2.

A typical problem when ferromagnetic substances are used to measure a magnetic field is magnetic hysteresis. Hysteresis means that the magnetic induction B is not a single-valued function of the magnetic field H. Hysteresis is caused by residual magnetization M. In suitable units, $B=\mu_o H+M$, where $\mu_o$ is the magnetic susceptibility. Residual magnetization M is a function of the history of H. A typical hysteresis behavior is shown in FIG. 4. If a gradient trapezoid with a positive amplitude is input to the gradient amplifier 127, the magnetic induction and magnetic fields in the iron core 12 follow the curve labeled OCEFA. At point A, the end of the trapezoid is reached and the primary current in amplifier output wire 14 goes to zero. If there were no residual magnetization in the iron core 12, the magnetic induction B would be equal to zero at point A and the secondary current in wire 20 would also be zero. The current monitor output would also be zero, the same as the primary current, and no further changes would take place. However, if there is residual magnetization, the Hall effect transducer 16 senses the residual magnetization at point A and creates a secondary current to null it. The current monitor output is proportional to the secondary current and the feedback signal which results causes a small primary current to flow through the gradient coil 26. The system reaches equilibrium for some primary and secondary currents. This is illustrated at point A in FIG. 4. The actual equilibrium point is a complicated function of the Hall effect transducer 16 and offset voltage and impedance, and the gradient amplifier feedback circuitry offset voltages and impedances. The result, however, is a small, non-zero, primary current through the gradient coil 26, even though no primary current is supposed to flow.

Figure 5:
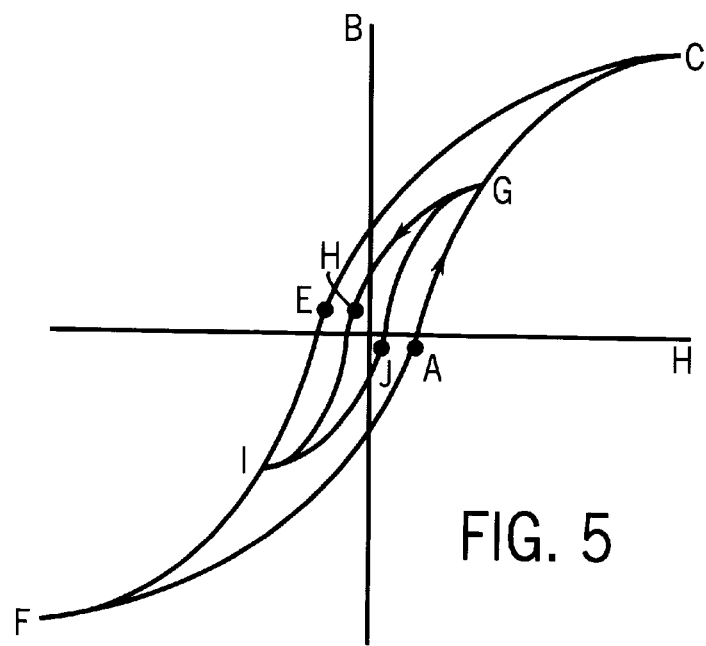

If another, identical, trapezoidal gradient waveform is produced, the magnetization of the iron core 12 follows the curve up to point C and back down to the same equilibrium point A. Referring particularly to FIG. 5, if a smaller amplitude trapezoidal waveform is input to amplifier 127, the trajectory AGHIJ is produced in the iron core 12. The final equilibrium point is point J. Because the amplitude of the trapezoid current waveform is smaller, the trajectory only makes it to point G before turning around. Because the residual magnetization is proportional to the amplitude of the magnetizing pulse, the final secondary and primary currents are smaller than for the case of the larger amplitude trapezoid. In fact, experiments have shown that the final primary "offset" current due to residual magnetization in iron core 12 is approximately proportional to the amplitude of the preceding gradient waveform.

In most cases the size of the residual offset current does not produce sufficient gradient fields to produce artifacts in the acquired image. Since the amount of offset current is proportional to the amplitude of the preceding gradient waveform, and since most scans use a series of pulse sequences with many different gradient amplitudes and polarities, the offset current varies considerably during the scan and no substantial net dephasing of the acquired NMR signals results. However, for a few pulse sequences the effects of the hysteresis offset current is problematic. One of these is interleaved gradient echo spiral scans in which each pulse sequence has a very long TE. The gradient field produced by the residual offset current from the previous pulse sequence has a long time to dephase the transverse magnetization. In addition, with interleaved spirals, the readout gradient waveforms are different and end with a different gradient amplitude for each interleave. Imaging artifacts and loss of signal result from this dephasing.

The solution to this problem is to add a reset gradient pulse to the end of each pulse sequence which returns the residual offset current produced by the gradient amplifier 127 to the same value. This results in the same residual gradient field after each pulse sequence with fewer resulting artifacts and a much higher NMR signal level. Testing indicates that this reset gradient pulse can hold its peak amplitude for as little as 8 μsecs. and that this peak amplitude is sufficient to drive the magnetization in the iron core 12 along its outermost hysteresis curve ACEF. This results in the same equilibrium point, either A or E, depending on reset gradient pulse polarity, at the completion of each pulse sequence.

In the alternative, the residual offset current produced by the gradient amplifier 127 can be driven to substantially zero at the end of each pulse sequence by applying a series of reset pulses of alternating polarity and steadily diminishing amplitude. This further reduces image artifacts and increases signal level.

DESCRIPTION OF THE PREFERRED EMBODIMENT

Figure 1:
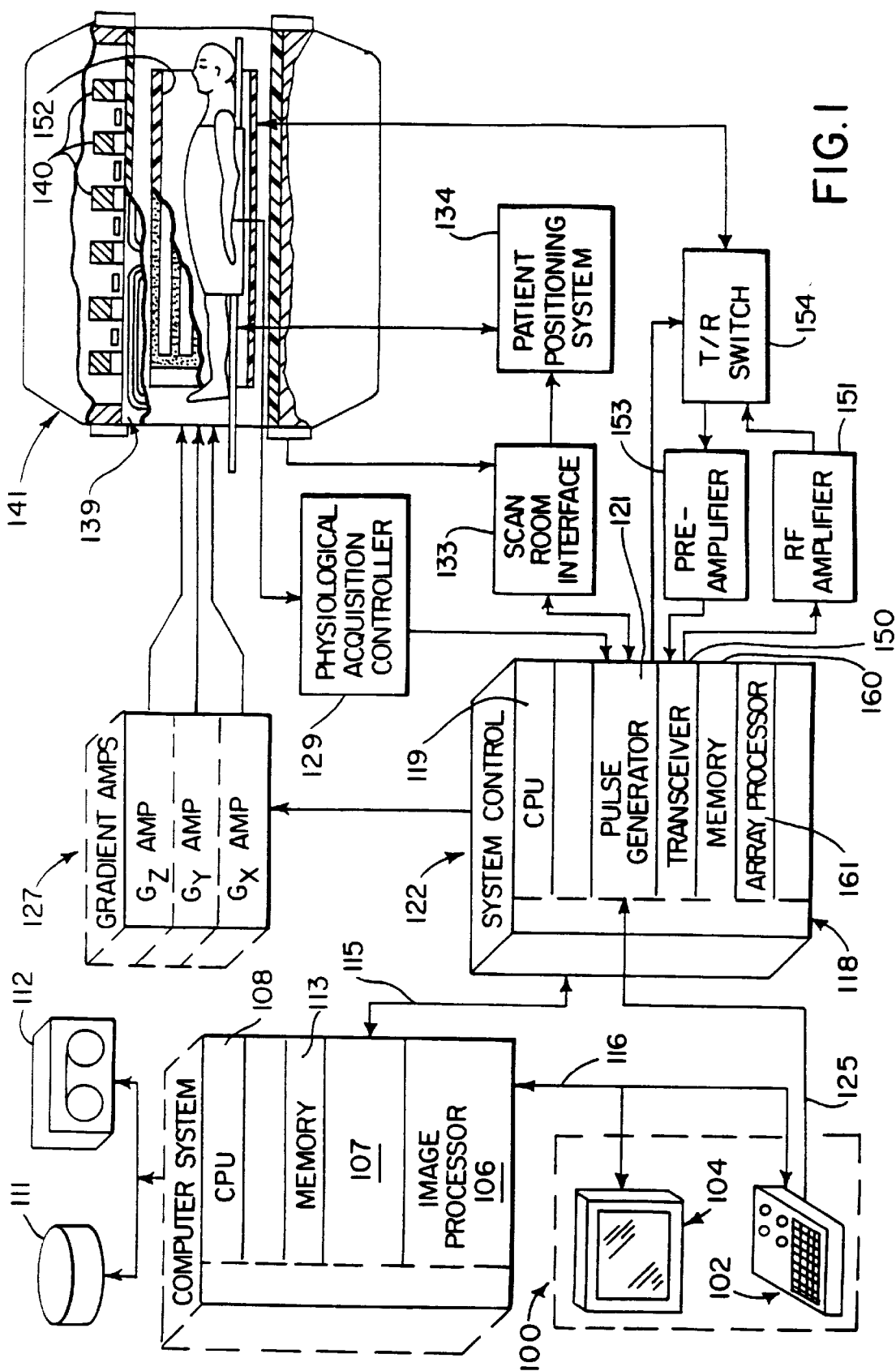
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier 127 excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

The present invention is implemented in the preferred embodiment by modifying the pulse sequences produced by the pulse generator 121. More particularly, the improvement is a modification of the gradient waveforms output to the gradient amplifiers 127 during the performance of a prescribed pulse sequence. This modification will be illustrated in the context of a scan in which a series of gradient recalled echo pulse sequences acquire image data by sampling a series of interleaved spirals.

Figure 6:
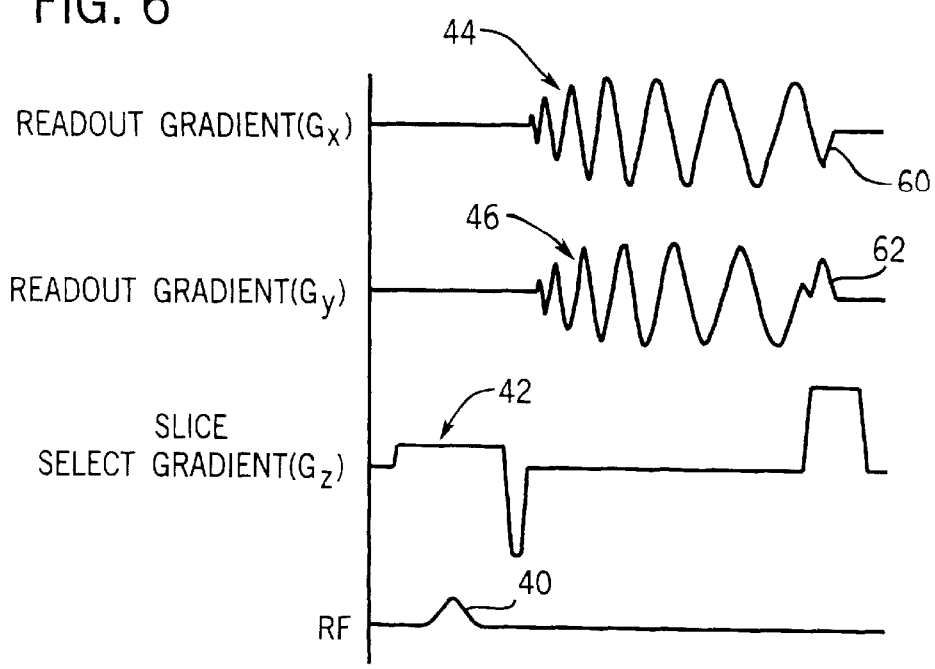
FIG. 6 is a graphic representation of a pulse sequence which samples k-space in a spiral pattern and which employs one embodiment of the invention to correct image artifacts.

Referring particularly to FIG. 6, a pulse sequence for acquiring one spiral interleave of k-space data includes an rf excitation pulse 40 which is produced in the presence of a slice select gradient pulse 42. Transverse magnetization is thus produced in the selected slice and an NMR signal is acquired in the presence of a readout gradient comprised of two, orthogonal, sinusoidal components 44 and 46. The readout gradient waveforms 44 and 46 are shaped to sample a spiral pattern in the two-dimensional k-space defined by the two orthogonal gradient axes. As is well known in the art, the readout gradient waveforms 44 and 46 can be shaped to sample along a spiral that starts at the center of k-space and winds outward to the periphery of k-space, or it can start at the periphery of k-space and wind inward to the center of k-space and back out to the periphery of k-space.

It is possible to acquire an entire image in one spiral acquisition, but in most applications the image data is acquired in a series of interleaved spiral acquisitions. To interleave the spiral patterns so that different k-space samples are acquired during each pulse sequence in the series, the phases of the sinusoidal readout gradient waveforms 44 and 46 are shifted in steps through a total of 360°. As a result, the amplitudes of these readout gradients 44 and 46 are different at the end of each pulse sequence in the series, and the residual offset current flowing in each readout gradient coil in assembly 139 is different at the completion of each pulse sequence.

To reduce image artifacts and increase NMR signal strength, the offset currents flowing in the readout gradient coils are driven to the same value at the completion of each pulse sequence by the application of reset gradient pulses. These reset gradient pulses can take a number of forms which will now be described, and they can be applied in a number of ways.

Figure 7:
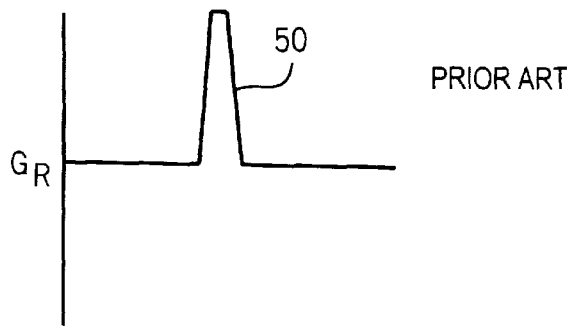

As shown in FIG. 7, the simplest form of the reset pulse is a trapezoidal gradient pulse 50. The plateau of the reset pulse 50 must have a duration and amplitude sufficient to drive the magnetization in the iron core 12 along its largest possible hysteresis curve. In the preferred embodiment the gradient is ramped up at maximum slew rate to its highest value and maintained for 8 $\mu$secs. It is then ramped down to zero at the maximum slew rate.

Figure 8:
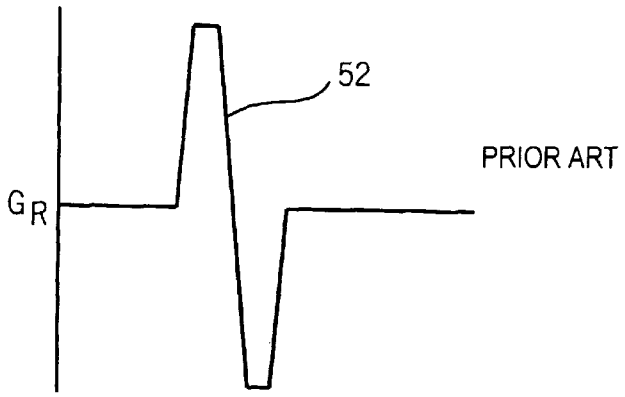

In applications where the net area of all applied gradients used during the pulse sequence is controlled by using rewinder gradient pulses, a bipolar reset gradient pulse 52 as shown in FIG. 8 may be used. The bipolar reset gradient pulse 52 is comprised of two identical trapezoidal lobes of opposite polarity. The amplitude and duration of each gradient lobe is the same as that described above for reset gradient pulse 50. If the last gradient lobe is negative as shown in FIG. 8, the residual offset current flows in the opposite direction as the residual offset current produced by the positive reset gradient pulse 50. The polarity of the two lobes in the bipolar reset gradient pulse 52 can be reversed to control the direction of the final residual offset current. While the bipolar reset gradient pulse 52 does not change the net gradient, it does require twice the length of the time to perform than the single lobe reset gradient pulse 50.

A third embodiment of the reset gradient pulse is shown in FIGS. 9 and 10. In this embodiment the reset gradient pulse is a series of gradient pulses of alternating polarity and steadily decreasing amplitude. In one version the reset gradient pulse is a sinusoidal waveform 54 and in another version it is a series of trapezoidal waveforms 56. In both cases the integral of the gradient waveform could be made zero so that the net added gradient is zero. In both versions the magnetization of the iron core 12 is driven around hysteresis loops of steadily decreasing size such that the residual magnetization at the completion of the waveform 54 or 56 is substantially zero. The residual gradient field at the completion of each pulse sequence is thus substantially zero with a consequent improvement in the NMR signal acquired during the subsequent pulse sequence. Unfortunately, however, the reset gradient pulse waveform 54 or 56 requires considerable time to play out (e.g. 5–10 msecs.) and can significantly increase total scan time.

There are three different methods for adding the reset gradient pulses described above to the imaging pulse sequence. One method is to create a separate pulse sequence comprised of the selected reset gradient pulse, and interleave the reset pulse sequence between each of the imaging pulse sequences in the scan. This method is easy to implement, but it increases scan time more than the other methods.

The second method is to append the selected reset gradient pulse to the end of the gradient waveform in the imaging pulse sequence. In the spiral pulse sequence of FIG. 6, for example, one of the reset gradient pulses of FIGS. 7–10 is added to the end of the readout gradient waveforms 44 and 46. This shortens total scan time over the first method.

As indicated above, imaging pulse sequences often include rewinder gradient pulses at the completion of their imaging gradient waveforms. Such rewinders are indicated by lobes 60 and 62 in FIG. 6. The purpose of the rewinder gradient lobe is to cause the total area under the readout gradient waveform to be zero. When the reset pulse is used with the rewinder gradient lobes 60, 62, the bipolar version 52 maintains zero area but it adds substantial time to the pulse sequence. Another embodiment of the invention combines the rewinder gradient lobe and the reset gradient pulse 52, allowing a single lobe reset pulse at the end of the rewinder gradient lobe. This integral rewinder/reset gradient waveform takes about half the time of the bipolar reset pulse 52 while maintaining zero area. The important point is that the combined rewinder waveform and reset gradient waveform have the same net area as the rewinder waveform, and that it end with a high amplitude gradient of at least 8 $\mu$sec duration.

While the present invention has been found to be particularly effective in reducing artifacts in images acquired with spiral sampling pulse sequences, it is also applicable to other imaging sequences. For example, the readout waveforms 44 and 46 can be changed to sample other patterns in k-space, such as rosettes and straight radial lines. The latter variation is referred to in the art as projection reconstruction.

What is claimed is:

1. In a magnetic resonance imaging system having a gradient amplifier with a current monitor that retains residual magnetism after the generation of an imaging gradient waveform during the performance of an imaging pulse sequence, the improvement comprising:

producing a reset gradient pulse waveform with the gradient amplifier after the gradient amplifier produces an imaging gradient waveform and before another imaging pulse sequence is performed, the duration and amplitude of the reset gradient pulse being selected to drive the residual magnetization of the current monitor to a preselected value, where the reset gradient waveform is comprised of a series of gradient lobes of alternating polarity and progressively decreasing amplitude, such that the preselected residual magnetization of the current monitor is driven to substantially zero.

2. The improvement as recited in claim 1 in which each gradient lobe is a trapezoidal lobe.

3. The improvement as recited in claim 1 in which each gradient lobe is a sinusoidal lobe.

4. A method for acquiring image data with a magnetic resonance imaging system, the steps comprising:

a) performing a series of imaging pulse sequences in which a readout gradient waveform is produced during each imaging pulse sequence as an NMR signal is acquired to sample k-space in a pattern, and the readout gradient waveform is changed in successive imaging pulse sequences to sample different regions of k-space; and b) producing a reset gradient pulse after each readout gradient waveform is produced to drive residual magnetization in an element which produces the readout gradient waveform to a preselected value.

5. The method as recited in claim 4 in which the k-space sampling pattern is a spiral.

6. The method as recited in claim 4 in which the k-space sampling pattern is a rosette.

7. A method for acquiring image data with a magnetic resonance imaging system, the steps comprising:

a) performing a series of imaging pulse sequences in which a readout gradient waveform is produced during each imaging pulse sequence as an NMR signal is acquired to sample k-space in a pattern, and the readout gradient waveform is changed in successive imaging pulse sequences to sample different regions of k-space; and b) producing a reset gradient pulse after each readout gradient waveform is produced to drive residual magnetization in an element which produces the readout gradient waveform to a preselected value, wherein the reset gradient pulses are produced in separate pulse sequences that are interleaved with the imaging pulse sequences.

8. The method as recited in claim 4 in which the reset gradient pulses are produced by adding a reset pulse gradient waveform to the end of the readout gradient waveform.

9. The method as recited in claim 8 in which the reset pulse gradient waveform is a trapezoid.

10. The method as recited in claim 8 in which the reset pulse gradient waveform is a pair of gradient lobes of opposite polarity and equal area.

11. The method as recited in claim 8 in which the reset pulse gradient waveform is a series of gradient lobes of alternating polarity and progressively decreasing amplitude, such that the preselected residual magnetization of said element is driven to substantially zero.

12. A method for acquiring image data with a magnetic resonance imaging system, the steps comprising:

a) performing a series of imaging pulse sequences in which a readout gradient waveform is produced during each imaging pulse sequence as an NMR signal is acquired to sample k-space in a pattern, and the readout gradient waveform is changed in successive imaging pulse sequences to sample different regions of k-space; and b) producing a reset gradient pulse after each readout gradient waveform is produced to drive residual magnetization in an element which produces the readout gradient waveform to a preselected value, wherein the reset gradient pulses are produced by combining a reset pulse gradient waveform with a portion of the readout gradient waveform.

13. The method as recited in claim 12 in which the reset pulse gradient waveform is a pair of gradient lobes of opposite polarity and equal area.

* * * * *